United States Patent [19]
Shiramizu et al.

[11] Patent Number: 5,762,779
[45] Date of Patent: *Jun. 9, 1998

[54] METHOD FOR PRODUCING ELECTROLYZED WATER

[75] Inventors: Yoshimi Shiramizu; Masaharu Nakamori; Hidemitsu Aoki; Hirofumi Seo; Haruto Hamano, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 474,910

[22] Filed: Jun. 7, 1995

Related U.S. Application Data

[62] Division of Ser. No. 410,309, Mar. 24, 1995, Pat. No. 5,543,030.

[30] Foreign Application Priority Data

Mar. 25, 1994 [JP] Japan ......... 6-56107

[51] Int. Cl.$^6$ ......... C02F 1/461
[52] U.S. Cl. ......... 205/746; 205/743; 134/2; 134/3
[58] Field of Search ......... 205/742, 743, 205/746; 134/2, 3

[56] References Cited

U.S. PATENT DOCUMENTS

| | | |
|---|---|---|
| 4,533,453 | 8/1985 | Oda et al. |
| 4,561,946 | 12/1985 | Suhara et al. |
| 4,627,899 | 12/1986 | Smith et al. |
| 4,661,218 | 4/1987 | Oda et al. |
| 5,234,563 | 8/1993 | Arai et al. ......... 204/229 |
| 5,374,341 | 12/1994 | Aoki et al. ......... 204/229 |
| 5,445,722 | 8/1995 | Yamaguti et al. ......... 204/229 |

FOREIGN PATENT DOCUMENTS

| | | |
|---|---|---|
| 0 061 594 | 10/1982 | European Pat. Off. |
| 0 185 228 | 6/1986 | European Pat. Off. |
| 0 600 470 | 6/1994 | European Pat. Off. |
| 3-236488 | 10/1991 | Japan |
| 4-314408 | 5/1992 | Japan |
| 5-084384 | 4/1993 | Japan |
| 5-154479 | 6/1993 | Japan |
| 5-202510 | 8/1993 | Japan |
| 5-245476 | 9/1993 | Japan |
| 6-260480 | 9/1994 | Japan |
| 1 754 798 | 8/1992 | U.S.S.R. |
| 1 555 397 | 11/1979 | United Kingdom |
| 2 202 551 | 9/1988 | United Kingdom |
| WO 95/32321 | 11/1995 | WIPO |

OTHER PUBLICATIONS

"Washing Design", Spring Edition, 1987, published by Kindai Hensyusha Syuppan. (No Month).

*Primary Examiner*—Arun S. Phasge
*Attorney, Agent, or Firm*—Young & Thompson

[57] ABSTRACT

The method for producing electrolyzed water includes the step of applying a voltage to electrodes disposed in an electrolytic cell containing therein pure water including electrolyte therein. A strength of an electric field generated by applying a voltage to the electrodes is controlled to be variable by means of various techniques. The method makes it possible to produce electrolyzed water with a smaller amount of energy than prior methods.

11 Claims, 11 Drawing Sheets

METHOD FOR PRODUCING ELECTROLYZED WATER

This application is a division of application Ser. No. 08/410,309, filed Mar. 24, 1995, now U.S. Pat. No. 5,543,030.

BACKGROUND OF THE INVENTION

1. Field of the Invention

The invention relates to a method for producing electrolyzed water, and more particularly to a method for producing electrolyzed water to be used for wet treatment of a semiconductor such as wet etching.

2. Description of the Related Art

A process of manufacturing a semiconductor device requires many wet treatments such as washing, etching and rinsing. In a process of manufacturing a semiconductor wafer, after a silicon ingot has grown, wet treatment is indispensable in a wafer slicing step and a mirror polishing step of a wafer in order to remove various contaminants such as silicon fine particles, abrasive powders and organic substances included in abrasive material. In such wet treatments are used chemicals such as organic solvents, strong acid and strong alkali. In a process of manufacturing a semiconductor device, prior to wafer processing steps, it is necessary to use many chemicals such as organic solvents, strong acid and strong alkali in many steps such as a Blanson washing step for cleaning a wafer with chemicals, and a photo-lithography step which further includes resist forming and removing steps, semiconductor layer forming and removing steps, insulating layer forming and removing step and metal layer forming and removing step.

As mentioned above, there are various wet treatments. The wet treatments used in a process for manufacturing a semiconductor device are grouped into three steps: a washing step, an etching step and a rinsing step. These three steps can be further categorized to the following three steps (A), (B) and (C).

(A) a substrate washing or rinsing step for removing contaminants adhered to the substrate without giving the substrate any influence. Herein, a substrate includes, for instance, a semiconductor layer, an insulating layer and a metal wire, and contaminants include, for instance, metal contaminants, organic or inorganic particles, residue of resist and ionic residue.

(B) a step for etching a substrate (C) an etching step for removing natural oxide film or organic film formed on a surface of a substrate For instance, in step (A) there are often used ammonium peroxide medium (APM) including $NH_4OH$, $H_2O_2$ and $H_2O$ at a ratio of 1:4:20 and sulfuric peroxide medium (SPM) including $H_2SO_4$ and $H_2O_2$ at a ratio of 5:1. In step (B) there is used hydrochloric peroxide medium (HPM) including HCl, $H_2O_2$ and $H_2O$ at a ratio of 1:1:6 as well as APM and SPM. In step (C) there is used dilute hydrogen fluoride (DHF) including HF and $H_2O$ at a ratio of 1:50 through 400 as well as APM and SPM.

Because of much use of chemical agents as aforementioned, it is required to have a plant for disposing of solid and liquid waste where the plant is expensive to run. Basic material in wet treatments is pure water. The used pure water is recycled by means of a closed system for reuse. Similarly, the chemical agents are also recycled for reuse. When the life of such recycled chemicals has expired and the chemicals are to be discarded, the chemicals are to be suitably decomposed and/or neutralized in order to prevent environmental pollution However, even if it is intended to reduce the amount of chemicals to be used by recycling, there is a limitation. In view of this problem, the inventors have invented an epochal method for wet treatment which is capable of remarkably reducing an amount of chemicals to be used, and have already filed a patent application with the Japanese Patent Office as Patent Application No. 5-105991 which was laid open to public on Sep. 16, 1994 as Patent Public Disclosure No. 6-260480. In this patent application, there is disclosed a method including the steps of electrolyzing pure water to which a quite small amount of electrolyte has been added, and washing a semiconductor with the thus obtained electrolyzed water. Hereinbelow, there will be explained an apparatus for carrying out the method disclosed in the above mentioned patent application, but it should be noted that the following explanation is only for better understanding of the present invention, and that the applicants do not admit the above mentioned patent application as prior art.

Hereinbelow, there will be briefly explained an apparatus for wet treatment with reference to FIG. 1. To an electrolytic cell 1, there is connected a conduit 12 through which the electrolytic cell 1 is supplied with pure water recycled through a water purifier 8 and an ion-exchanger 9 from waste liquid reservoir 7, and also with electrolyte to be added to the pure water through an electrolyte supplier 10. The electrolyte is added to the pure water for decreasing the specific resistance of the pure water. For instance, bubbling of carbon dioxide ($CO_2$) and supporting electrolytic salt of ammonium acetate ($CH_3COONH_4$) are used as an electrolyte source. The electrolytic cell 1 is divided into two sub-cells 1a and 1b by a partition membrane 2 composed of a material which does not allow water to pass therethrough, but allows ion to pass therethrough, such as porous silicon. In each of the sub-cells 1a and 1b is disposed an anode 3a and a cathode 3b each composed of platinum (Pt) or carbon (C). The anode 3a is connected to a positive terminal of a DC voltage source 5, while the cathode 3b is connected to a negative terminal of the DC voltage source 5. Electrolyzed water in each of the sub-cells 1a and 1b is introduced into disposal cells 6a and 6b, respectively. Waste solution discharged from the disposal cells 6a and 6b is gathered in the waste liquid reservoir 7, and then is purified in the water purifier 8, and further is recycled into pure water in the ion-exchanger 9. Each of the disposal cells 6a and 6b is provided with pH sensors 4a and 4b, respectively, for sensing $H^+$ concentration or OH− concentration of the electrolyzed pure water. A pH regulator 11 receives signals representing $H^+$ or OH− concentration from the pH sensors 4a and 4b, to thereby provide the electrolyte supplier 10 and the DC voltage source 5 with signals for controlling the DC voltage and the amount of electrolyte to be added to the pure water. Thus, the pH of the electrolyzed pure water is maintained in a desired range.

Hereinbelow, there will be explained the method for wet treatment to be carried out using the above mentioned wet treatment apparatus. After pure water containing electrolyte has been provided to the electrolytic cell 1, across the anode 3a and the cathode 3b is applied a DC voltage intensive enough to generate an electric field having the electric field strength in the range of $10^3$ to $10^4$ V/cm, whereby the pure water is electrolyzed. The added electrolyte is being ionized to anion and cation in the pure water. Thus, when a DC voltage is applied to the anode 3a and the cathode 3b, the ionized anion and cation are attracted to the cathode 3b and the anode 3a, respectively, whereby an electrical current is generated across the electrodes 3a and 3b. The generation of an electrical current triggers electrolysis of the pure water. On the surface of the anode 3a is generated oxygen gas ($O_2$), and thereby anodic water is generated. Herein, anodic water means water containing a high concentration of $H^+$ ion therein. On a surface of the cathode 3b is generated hydrogen gas ($H_2$), and thereby cathodic water is generated. Herein, cathodic water means water containing a high concentration of $OH-$ ion therein. The anodic water is acidic, and is effective in the removal of contaminants contaminated with heavy metal, which used to be performed by using SPM and HPM, and also in metal etching The cathodic water is alkaline, and is effective in the removal of abrasive colloidal silica and residual chlorine ion, which used to be performed by using APM. The used anodic and cathodic water are mixed with each other in the waste liquid reservoir 7, and are regenerated to pure water.

In accordance with the method mentioned so far, it is possible to remarkably reduce the use of chemicals such as acid and alkali with the result of smaller amount of waste. Thus, compared to a conventional method, the method makes it possible to reduce the amount of waste and cost for disposing of waste, and also makes it unnecessary to build a waste disposing plant, with the result of lower manufacturing cost of semiconductors. Thus, large economic advantages can be expected.

In "Washing Design", Spring Edition, 1987, published by Kindai Hensyusha Syuppan, an article titled "Redox washing method: New washing method in electronic industry" has suggested a method in which electrolyzed water is used, for instance, for silicon etching and for removing oxide film formed on a surface of aluminum layer. The suggested method includes the steps of electrolyzing pure water or tap water including a low concentration of electrolyte, and etching silicon by using the obtained cathodic water. In accordance with the method, impurities adhered to or dispersed on the surface of silicon together with the surface of silicon can be removed by etching. If aluminum wiring is immersed in place of silicon, the oxide film formed on the surface of the aluminum wiring can be removed without overetching the aluminum wiring.

When the above mentioned apparatus is to be used in an experiment, only a small amount of electrolyzed water is needed per unit period of time. However, when the apparatus is to be used in actual semiconductor manufacturing step, it is necessary to further increase the ability to produce electrolyzed water. Recently, 8 inch wafers have often been used. For instance, if it is intended to cleanse 1 lot including fifty 8 inch wafers by a batch method, then it is necessary to prepare at least 50 liters of electrolyzed water. However, if it takes too long to produce a required amount of electrolyzed water, a throughput goes down, and further there is a fear that oxidation reduction potential (hereinafter, referred to simply as "ORP") of the electrolyzed water may be changed. For increasing the production of electrolyzed water only, the electrolysis area may be increased or a larger voltage may be applied to the electrodes. However, if a larger voltage is to be applied to electrodes, it would be necessary to install a high voltage generating apparatus and an apparatus for safety, and also be necessary to often exchange the electrodes because the life of the electrodes is made shorter due to a larger voltage applied thereto, thereby increasing the cost for such apparatuses. In addition, the battery exchanges tend disadvantageously to introduce particles and other contaminants, which are the most deadly foe to the wet treatment apparatus, into the wet treatment apparatus. On the other hand, if the electrolysis area is to be enlarged, a greater amount of electrolyzed water can be produced, but the consumption of electrical power is also increased. Thus, the above mentioned method cannot further increase the production efficiency of electrolyzed water.

Furthermore, the production of electrolyzed water (anodic water or cathodic water) has been controlled by monitoring a pH value, that is, $H^+$ concentration or a pOH value, that is, $OH-$ concentration. However, the inventors have discovered the fact that ORP, which means a potential representing, the intensity of oxidation or reduction, may vary though a pH value hardly varies at all in the case of electrolyzed water. In addition, the inventors have also discovered the fact that ORP is a parameter which is capable of varying independently of a pH value.

FIG. 2 is a graph showing successive change of a pH value and ORP overtime when anodic and cathodic waters are stored for 0 through 140 hours in two polyethylene containers A and B of openings having different diameters. The container A has a barrel body having about 10 cm of diameter and has a narrow opening having 1.5 cm of diameter, while the container B has a barrel body having about 10 cm of diameter and has an opening having the same diameter as that of the body. Each of the containers A and B is filled with electrolyzed water, and is hermetically sealed with a cap. As a result of this experiment, the inventors discovered that ORP remarkably varies though the pH value only slightly varies. The cathodic water varies more remarkably than the anodic water, and ORP varies in a different way in each of the containers A and B. For instance, when the cathodic water having a pH of 10.5 and an ORP of −800 mV was contained in the container B, the pH value was kept almost constant for approximately 140 hours, but ORP returned to approximately 0 mV after only an hour. On the other hand, when the cathodic water was contained in the container A, it took approximately 70 hours for ORP to return to approximately 0 mV. The pH value stayed constant. Though the reason why ORP varies in different fashion in dependence on the containers is not known, it is considered as follows. Though the containers are hermetically sealed with a cap for isolating the contents from the atmosphere, the cap is removed from the container when ORP is measured. Thus, the contact area of the electrolyzed water the with atmosphere when a probe is inserted into the electrolyzed water is varied in each of the containers. The difference in contact area between the containers having different opening diameters may influence ORP. The anodic water varied more slightly than the cathodic water, but, as is shown in FIG. 2, ORP decreased from approximately 1200 mV to approximately 1100 mV in 70 hours. The pH value stayed at approximately 1.5, and did not change. Thus, it was understood that only ORP was varied in the anodic water.

In view of the above mentioned results, when electrolyzed water is to be used for wet treatment, electrolyzed water has to be prepared taking successive changes of ORP into consideration. For instance, even though much time is spent preparing an adequate amount of cathodic water for electrolysis in order to remove colloidal silica located on the silicon, if a lot to be treated arrives too late for some reason, the prepared electrolyzed water would be deteriorated and hence could not be used. In such a case, the electrolyte and electrical power consumed to produce the electrolyzed water have been wasted. Though electrolyzed water having ORP having a large absolute value may be produced taking the deterioration of electrolyzed water into consideration, the consumption of electrical power is disadvantageously increased. Thus, it is desired to enhance the production efficiency of electrolyzed water so that an adequate amount of electrolyzed water can be produced in a short period of time in order to timely prepare electrolyzed water.

The above mentioned article included in "Washing Design", Spring Edition, 1987, merely reports that a surface of silicon can be etched or an oxide film of aluminum can be removed by immersing a silicon piece or aluminum wiring, in cathodic water. In addition, when pure water is to be electrolyzed, electrolysis cannot be carried out unless a high voltage is applied to the electrodes because pure water has a high resistivity, specifically, 18 MΩ·cm. Furthermore, it is necessary to use a special equipment for applying a high voltage. If pure water contains electrolyte even in a small amount, it is possible to decrease the voltage to be applied. However, documents known in the art merely teach electrolyte such as tap water, ethylenediaminetetraacetic acid (EDTA) which is effective in removal of fingerprints, and citric acid. These electrolytes are all unpreferable or the most deadly foe to a semiconductor device, and hence cannot be used. In the above mentioned patent application filed by the inventors, only an electrolyte having no influence on a semiconductor device is selected for use, but the production efficiency of electrolyzed water is still dissatisfactory. If the voltage is not increased and the amount of added electrolyte is increased, the production efficiency of electrolyzed water can be enhanced. However, in such a case, it is impossible to reduce the amount of chemicals to be used.

SUMMARY OF THE INVENTION

In view of the above mentioned problems, it is an object of the present invention to make it possible to rapidly produce electrolyzed water.

Another object of the present invention is to decrease energy which was conventionally consumed in obtaining a desired amount of electrolyzed water.

A further object of the present invention is to enhance the production efficiency of electrolyzed water without applying a higher voltage to the electrodes.

A further object of the present invention is to produce electrolyzed water with less amount of electrolyte.

A still further object of the present invention is to reduce the use of chemicals and hence waste derived from chemicals, and also to simplify the equipment for collection and disposal of the waste, to thereby reduce the cost while preventing pollution of environment.

In one aspect, the invention provides a method for producing electrolyzed water, including the step of applying a voltage to electrodes disposed in an electrolytic cell containing therein pure water including electrolyte therein. In this step, the strength of an electric field generated by applying a voltage to the electrodes is controlled to be variable.

In a preferred embodiment, the electric field strength is varied by varying the distance between the electrodes.

In another preferred embodiment, the distance between the electrodes is varied by displacing at least one of the electrodes.

In still another preferred embodiment, the distance between the electrodes is made smallest when electrolysis is to start, and made gradually larger after electrolysis has started.

In the method in accordance with the invention, it is preferable that the distance between the electrodes, that is an anode and a cathode, is made smallest at the start of electrolysis because the highest voltage is required for starting electrolysis. This ensures that the resistance between anode and cathode is smallest, and hence it is possible to start electrolysis even when the applied voltage is small. Then, after electrolysis has started, a distance between the electrodes is made larger to thereby decrease the strength of the electric field. The decrease of electric field strength prevents $H^+$ ion and $OH-$ ion generated at the anode and cathode, respectively, from being attracted to the cathode and anode anode, respectively, to thereby prevent neutralization of $H^+$ and $OH-$ ions. Thus, $H^+$ ions remain in the vicinity of an anode to thereby increase $H^+$ concentration around the anode, while $OH-$ ions remain in the vicinity of a cathode to thereby increase $OH-$ concentration around the cathode. Similarly, oxidizing material and reducing material remain in the vicinity of an anode or cathode, respectively, to thereby increase the concentration thereof around the electrodes. Herein, the oxidizing material and reducing material means material which is generated depending on added electrolyte and electrolysis conditions, and determines ORP. Thus, it is possible to reduce the maximum voltage to be applied to the electrodes, by designing the distance between the electrodes to be variable. In addition, the method makes it easy to increase or decrease the production of $H^+$ ion, $OH-$ ion, oxidizing material and reducing material, with the result that it is possible to efficiently obtain anodic water and cathodic water suitable to various wet treatments.

In addition, if a strong electrolyte containing halogen therein is selected, it is possible to apply even lower voltage to the electrodes than if a weak electrolyte is selected. Furthermore, compared to a weak electrolyte, the amount of electrolyte to be added to pure water can be decreased for a strong electrolyte, and thus the use of chemicals can be further decreased.

The electric field strength may be varied by varying the voltage applied to the electrodes. It is preferable that the voltage is gradually increased after electrolysis has started. The gradual increase of the voltage decreases the maximum voltage to be applied to the electrodes, thereby it is possible to prevent fatigue of the electrodes.

The electric field strength may be varied by varying an area of a portion of the electrodes at which the electrodes face each other. By varying the facing area of the electrodes, it is possible to control the production of electrolyzed water to thereby obtain most of the electrolyzed water in a short period of time. Thus, it is no longer necessary to consider successive changes of ORP, and thus set ORP high. Thus, it is possible to save excessive energy and time which conventionally had to be spent due to the successive change of ORP. In addition, it is also possible to continue electrolysis that produces only a small amount of electrolyzed water, and hence it is no longer necessary to stop electrolysis for preventing the produced electrolyzed water from becoming neutralized. Thus, there occurs no problem when electrolysis is restarted.

In order to vary the facing area of the electrodes, it is preferable that the electrodes are composed of a plurality of pairs of sections each of which faces each other. In this embodiment, the facing area of the electrodes can be varied by applying a voltage to a desired number of the sections.

In another aspect, the invention provides a method for producing electrolyzed water, including the steps of (a) applying a voltage to electrodes disposed in an electrolytic cell containing therein pure water including electrolyte therein, and (b) applying ultrasonic waves to the pure water while the step (a) is being carried out.

By additionally applying ultrasonic waves to pure water containing electrolyte therein, the decomposition of clusters of water molecules is facilitated with the result that electrolysis is also facilitated.

In still another aspect, the invention provides a method for producing electrolyzed water, including the steps of (a) applying a voltage to electrodes disposed in an electrolytic cell containing therein pure water including electrolyte therein, and (b) controlling the temperature of the pure water while the step (a) is being carried out.

Pure water not electrolyzed has a boiling point at approximately 100 degrees centigrade. On the other hand, electrolyzed water produced from plain pure water or pure water containing electrolyte therein has a boiling point below 100 degrees centigrade, because electrolyzed water has smaller clusters of water molecules than unelectrolyzed or plain pure water. In addition, ozone gas dissolved in electrolyzed water is chemically more active than ozone gas dissolved in unelectrolyzed water, and hence, the electrolyzed water has a greater oxidizing ability than unelectrolyzed water. However, if the temperature of electrolyzed pure water is too high, the oxidizing and reducing materials tend to move away from the electrode at which the oxidizing or reducing material is generated, and if the temperature of electrolyzed pure water is too low, the clusters of water molecules cannot be dispersed, and thus electrolysis cannot be facilitated. Thus, the temperature of the pure water is controlled to be preferably in the range of 15 to 100 degrees centigrade, more preferably in the range of 20 to 70 degrees centigrade.

In yet another aspect, the invention provides a method for producing electrolyzed water, including the steps of (a) applying a voltage to electrodes disposed in an electrolytic cell containing therein pure water including electrolyte therein, and (b) applying a magnetic field to the pure water while the step (a) is being carried out.

A magnetic field applied to the pure water contained in an electrolytic cell deflects $H^+$ ion and $OH-$ ion moving perpendicularly to electrodes, in accordance with Fleming's rule. This phenomenon is explained as the generation of Lorentz's field. The faster ions flow, the greater strength the Lorentz's field has. The attenuation of ions occurs at the center of the flow of ions. A voltage between electrodes becomes greater in accordance with the strength of the Lorentz's field with the result that ions are advantageously gathered around an electrode at which the ions are generated. If the attenuation of ions is facilitated, it is possible to remove a partition membrane.

In still yet another aspect, the invention provides a method for producing electrolyzed water, including the steps of (a) applying a voltage to electrodes disposed in an electrolytic cell containing therein pure water including electrolyte therein, and (b) applying a pressure to the pure water while the step (a) is being carried out.

The pressure is preferably controlled to be variable to thereby suppress the production of one of anodic electrolyzed water and cathodic electrolyzed water.

When one of anodic electrolyzed water and cathodic electrolyzed water is to be used or is intended to be increased in volume, only one of them can be produced by optimizing pressure and/or temperature of electrolyzed pure water. Thus, it is possible to selectively increase the production of a desired one of anodic and cathodic electrolyzed water, and thus to reduce the production of the other.

In a further aspect, the invention provides a method for producing electrolyzed water, including the steps of (a) forming first and second electrolytic cells so that one of the sidewalls of the electrolytic cells is composed of a partition membrane and faces each other in spaced relationship from each other, wherein the partition membrane of the first electrolytic cell is composed of an internal cation exchange membrane and an external gas-permeable membrane, and the partition membrane of the second electrolytic cell is composed of an internal anion exchange membrane and an external gas-permeable membrane, (b) providing pure water in each of the first and second electrolytic cells, the pure water including electrolyte therein, (c) applying a voltage to both the an anode disposed in the first electrolytic cell and cathode disposed in the second electrolytic cell, and (d) discharging waste solution through a space between the sidewalls of the two electrolytic cells.

By providing a partition membrane of two membranes: an ion-exchanging membrane which allows ions to pass therethrough, but does not allow water molecules to pass therethrough; and a gas-permeable membrane which allows unnecessary gas generated by electrolysis to pass therethrough, it is possible to remove materials which prevent the production of $H^+$ ion, $OH-$ ion, oxidizing material and reducing material, and gas unnecessary for wet treatment. Thus, it is possible to selectively gather $H^+$ ion and oxidizing material in anodic electrolyzed water, and also to selectively gather $OH-$ ion and reducing material in cathodic electrolyzed water.

The advantages obtained by the aforementioned present invention will be described hereinbelow.

As explained above, the invention makes it possible to (a) produce electrolyzed water a short period of time, (b) decrease energy which was conventionally wasted in obtaining a desired amount of electrolyzed water, (c) enhance the production efficiency of electrolyzed water without applying a higher voltage to the electrodes, and (d) produce electrolyzed water with a smaller amount of electrolyte. As a result, the invention reduces the use of chemicals and hence waste derived from chemicals, and also simplifies the equipment for collection and disposal of waste, to thereby reduce the cost while preventing environmental pollution.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[Embodiment 1]

Figure 1:
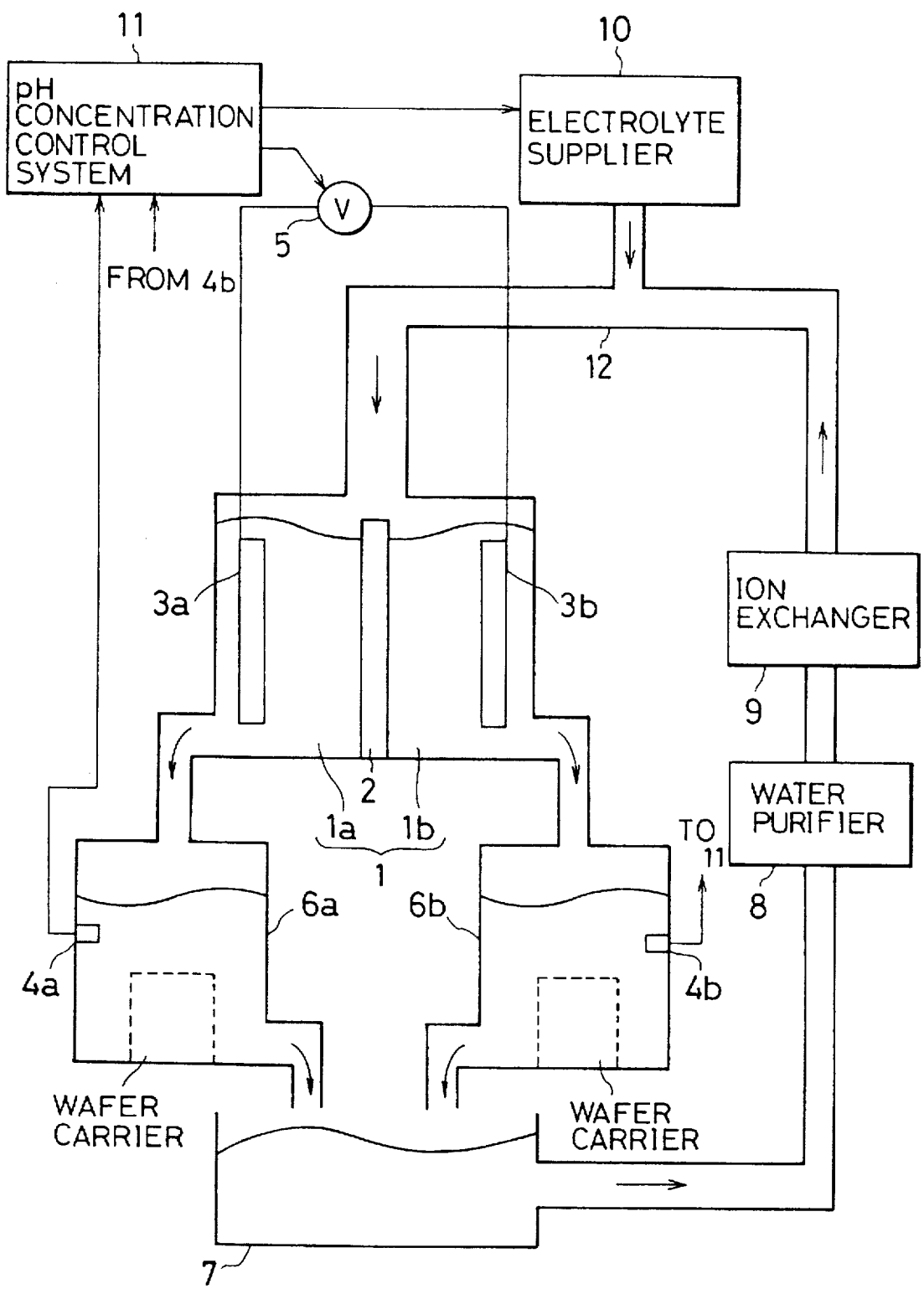
FIG. 1 is a schematic view illustrating an apparatus for wet treatment of semiconductor previously invented by the inventors.
Figure 2:
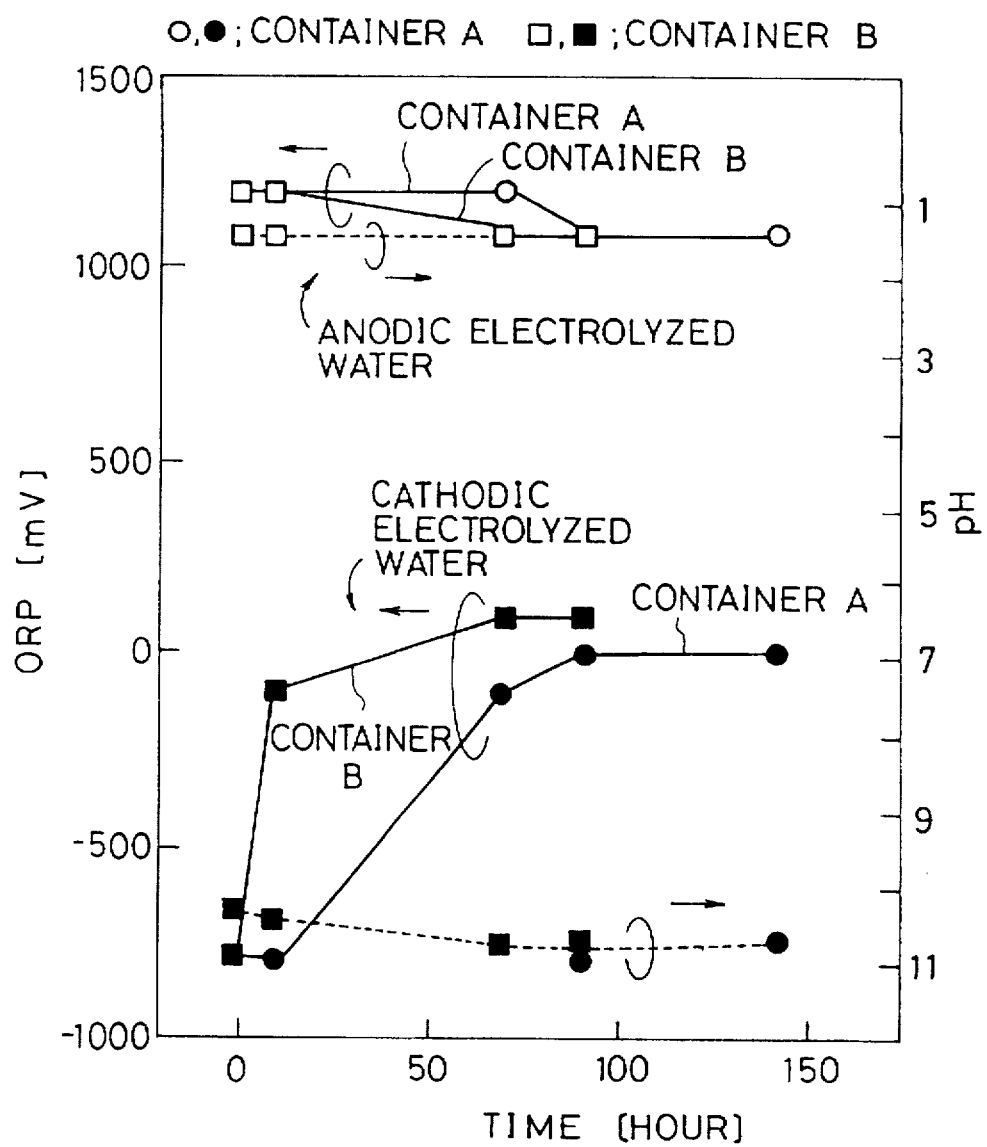
FIG. 2 is a graph showing successive changes of pH and ORP values.
Figure 3:
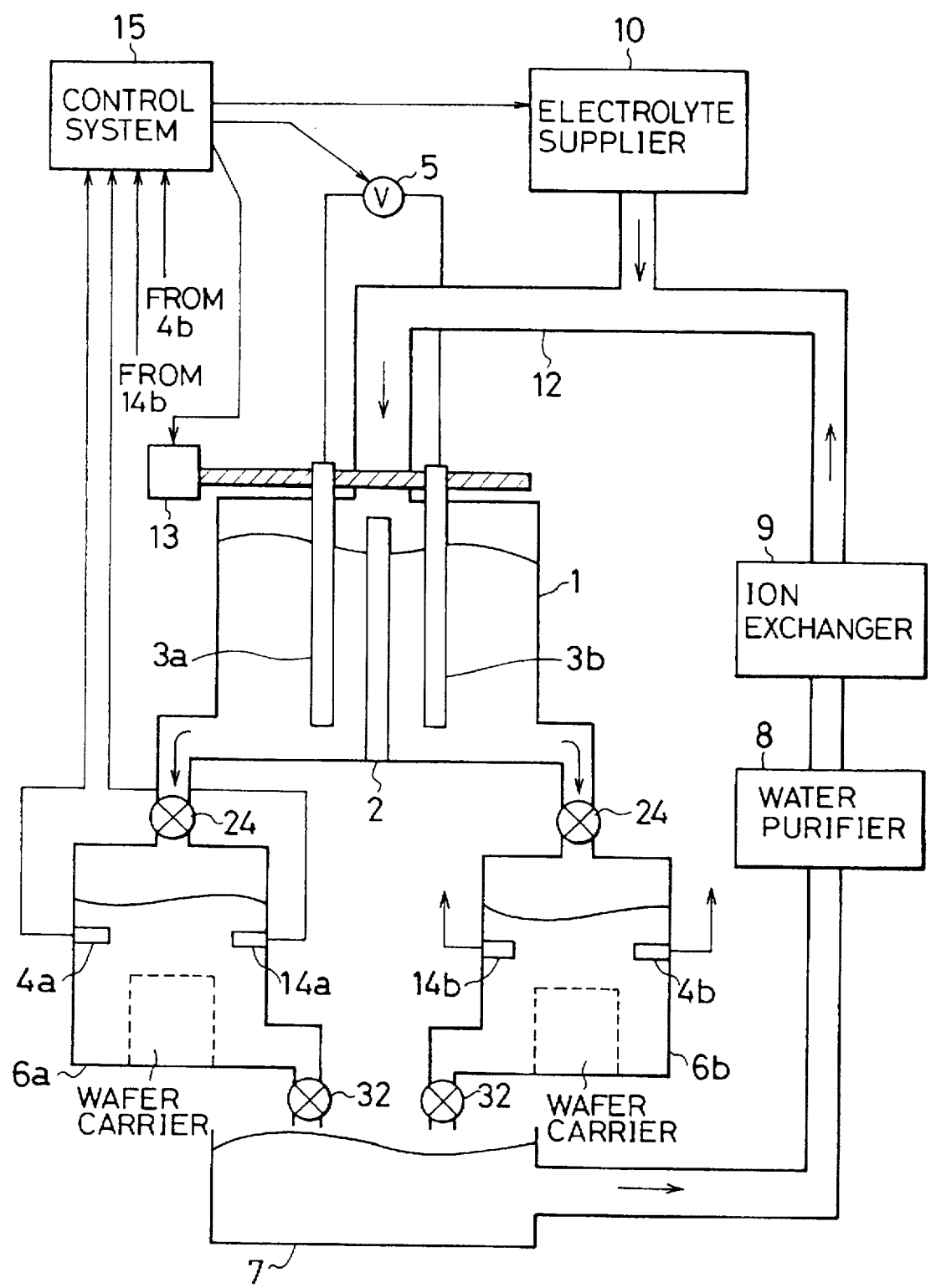
FIG. 3 is a schematic view illustrating a wet treatment apparatus in accordance with a first embodiment.

Hereinbelow will be explained a first embodiment in accordance with the invention with reference to FIG. 3. In FIG. 3, elements which correspond to those in FIG. 1 have been provided with the same reference numerals, and hence are not explained in detail.

The anode $3a$ and cathode $3b$ made of platinum (Pt) are connected to an electrode mover 13. The electrode mover 13 is designed to move simultaneously both of the anode $3a$ and cathode $3b$ in opposite directions, specifically, the direction in which the anode $3a$ and cathode $3b$ approaches each other and the direction in which the anode $3a$ and the cathode $3b$ move away from each other. The electrode mover 13 is designed also to move only one of the anode $3a$ and cathode $3b$. That is, the electrode mover 13 can keep, for instance, the anode $3a$ stationary, and move only the cathode $3b$ in the direction in which the cathode $3b$ approaches the anode $3a$ or the direction in which the cathode $3b$ moves away from the anode $3a$. The electrode mover 13 has a conventional structure. For instance, the electrode mover 13 includes an electrode holder having a right-hand threaded portion and a left-hand threaded portion, and a motor connected to one end of the electrode holder. Each of the electrodes $3a$ and $3b$ is connected to the right-hand threaded portion and the left-hand threaded portion, respectively. The rotation of the electrode holder by the motor causes the anode $3a$ and cathode $3b$ to approach each other or move away from each other in dependence on the direction of rotation of the electrode holder. Thus, the electrode mover 13 can move the anode $3a$ and cathode $3b$ with a distance between the partition membrane 2 and each of the electrodes $3a,3b$.

In the disposal cells $6a$ and $6b$, are disposed ORP sensors $14a$ and $14b$ as well as the pH sensors $4a$ and $4b$. A control system 15 receives signals transmitted from the pH sensors $4a$, $4b$ and ORP sensors $14a$, $14b$, and provides commands to the electrolyte supplier 10 and the DC voltage source 5 in accordance with the signals. The control system 15 also provides a command to the electrode mover 13 to thereby vary a distance between the anode $3a$ and the cathode $3b$. It is preferable to dispose valves 24 between the electrolyte cell 1 and the disposal cells $6a$, $6b$, and also dispose valves 32 at waste solution outlets of the disposal cells $6a$, $6b$ in order to control flow rate of electrolyzed water and waste solution.

Next, a method for producing electrolyzed water will be explained. In this case, 2 millimol/liter (mM) of ammonium chloride as electrolyte is to be added to pure water. A distance between the anode $3a$ and the cathode $3b$ at the start of electrolysis is set, for instance, to be 6 mm. The resistivity of the pure water containing the electrolyte therein is presumed to be hundreds of $k\Omega \cdot cm$. An ideal voltage for electrolysis when a distance between the electrodes is zero (0) is in the range of 1.2 to 2 V. In order to perform a necessary electrolysis speed, an electrical current has to run to some degree. Thus, a voltage in the range of approximately 3 to 300 V is applied to the electrodes, because it is necessary to apply a voltage equal to a sum of the ideal electrolysis voltage and a voltage corresponding to a resistance of bulk water. It is preferable to apply a voltage in the range of 10 to 50 V because, under such a range of voltage, the electrolysis speed can be easily controlled. When a voltage is to be applied, if a voltage is gradually increased, it is possible to prevent an electrical current from suddenly running at the start of electrolysis, thereby fatigue of the electrodes can be prevented. Once electrolysis has started, ions derived from the electrolyte and pure water freely move in the electrolyzed water, and thus the resistivity is decreased to approximately one-tenth relative to the initial resistivity. Then, the electrode mover 13 increases a distance between the electrodes $3a$, $3b$ to 6 cm in order to attract ions around each of the electrodes at which the ions are generated. Even if a distance between the electrodes is increased by ten times, the applied voltage remains the same as the voltage having been applied at the start of electrolysis, and hence it is possible to carry out electrolysis without raising the voltage applied to the electrodes.

Hereinbelow there will be explained how electrolyzed water is produced under the presence of ammonium chloride as electrolyte. The electrolyte is added to pure water in order to reduce the electrical resistance of pure water. The amount of electrolyte to be added to pure water has equal to or below 20 mM. The more that electrolyte is added to pure water, the higher the current density is due to the decrease of electrical resistance. If the amount of added electrolyte is over 200 mM, the current density becomes too high, and thus gas is generated in the vicinity of the electrodes. Constituents which should be present in electrolyzed water are discharged together with the gas out of the electrolyzed water, resulting in that it is impossible to obtain electrolyzed water having the desired characteristics. Accordingly, the amount of added electrolyte is preferably equal to or less than approximately 80 mM in order to prevent generation of the gas.

At the anode $3a$ disposed in the electrolytic cell 1, there occurs electron exchanges within a surface of the anode $3a$ and also electron exchanges between generated ions. As a result, the following electrochemical reactions occur at the anode $3a$.

(a) $2H_2O \longrightarrow O_2 + 4H_+ + 4e^-$ or $3H_2O \longrightarrow O_3 + 6H_+ + 6e^-$ (b) $NH_4Cl \longrightarrow NH_3 + H_+ + Cl^-$ (c) $2Cl^- \longrightarrow Cl_2 + 2e^-$ (d) $Cl_2 + 2H_2O \longrightarrow 2H_+ + 2HClO + 2e^-$, $Cl_2 + 4H_2O \longrightarrow 6H_+ + 2HClO_2 + 6e^-$, or $Cl_2 + 6H_2O \longrightarrow 12H_+ + 2ClO_3^- + 10e^-$ (e) $3HClO \longrightarrow 3H_+ + ClO_3^- + 2Cl^-$ On the other hand, at the cathode $3b$, occurs the following electrochemical reactions.

(f) $NH_4Cl \rightarrow 2NH_3 + H_2 + 2Cl^-$ (g) $2NH_3 + H_2O \rightarrow 4NH_4^+ + 2OH^-$ (h) $2H_2O + 2e^- \rightarrow 2OH^- + H_2$ At the anode $3a$, oxygen gas, ozone gas and chlorine are generated gas, and at the same time hydrogen ions, and hypochlorite ions, chlorite ions and chlorate ions that is ions composed of a combination of chlorine and oxygen (hereinafter, referred to as ClOx–), and chloride ions also generate. Since ClOx– is the most active among them, it reacts with a small amount of metal impurities which could not be removed out of pure water, and thus tends to become chloride ions which have no oxidizing ability. On the other hand, ozone gas, hydrogen ions and ClOx– are each present in anodic electrolyzed water are have strong oxidizing ability, and hence it is considered that ORP is determined by an amount of them. Accordingly, there may be prepared an apparatus for monitoring an amount of ozone gas, hydrogen ion and ClOx– dissolved in anodic electrolyzed water instead of monitoring ORP, to thereby allow the control system 15 to issue command signals in accordance with an amount of the above mentioned dissolved gas.

An amount Qi of oxidation and reduction constituents i generated due to electrolysis is denoted by the following equation.

$$Qi = ki \cdot V \cdot S \cdot t(\rho w \cdot d + Rm + Ri) \qquad (i)$$

wherein:

Ki is a constant relating to a constituent i;

V represents a voltage to be applied to electrodes;

S represents an area of electrodes;

t represents a period of time during which electrolysis is carried out;

$\rho$ w represents electric resistance of electrolysis water;

d represents a distance between electrodes;

Rm represents an electrical resistance of a partition membrane;

Ri is a constant which represents how easily a reaction for producing the constituent i occurs, and which is determined by the type of material of which the electrodes are composed. ORP is more dependent upon the amount of oxidation and reduction constituents than is the pH. Thus the control system 15 monitors ORP in particular. If ORP shifts to a positive value in the anodic electrolyzed water or if ORP shifts to a negative value in cathodic electrolyzed water, the control system 15 moves the electrodes so that the distance between them becomes larger. In the reverse case, the control system 15 moves the electrodes so that the distance between them becomes smaller. As a result, the amount of Qi is increased or decreased to thereby control ORP. If the control of ORP reaches a step in which a fine adjustment is required, an applied voltage is also adjusted only by small degrees. Thus, it is possible to catch up with the ORP control speed, and in addition a high voltage is not required.

[Embodiment 2]

Figure 4:
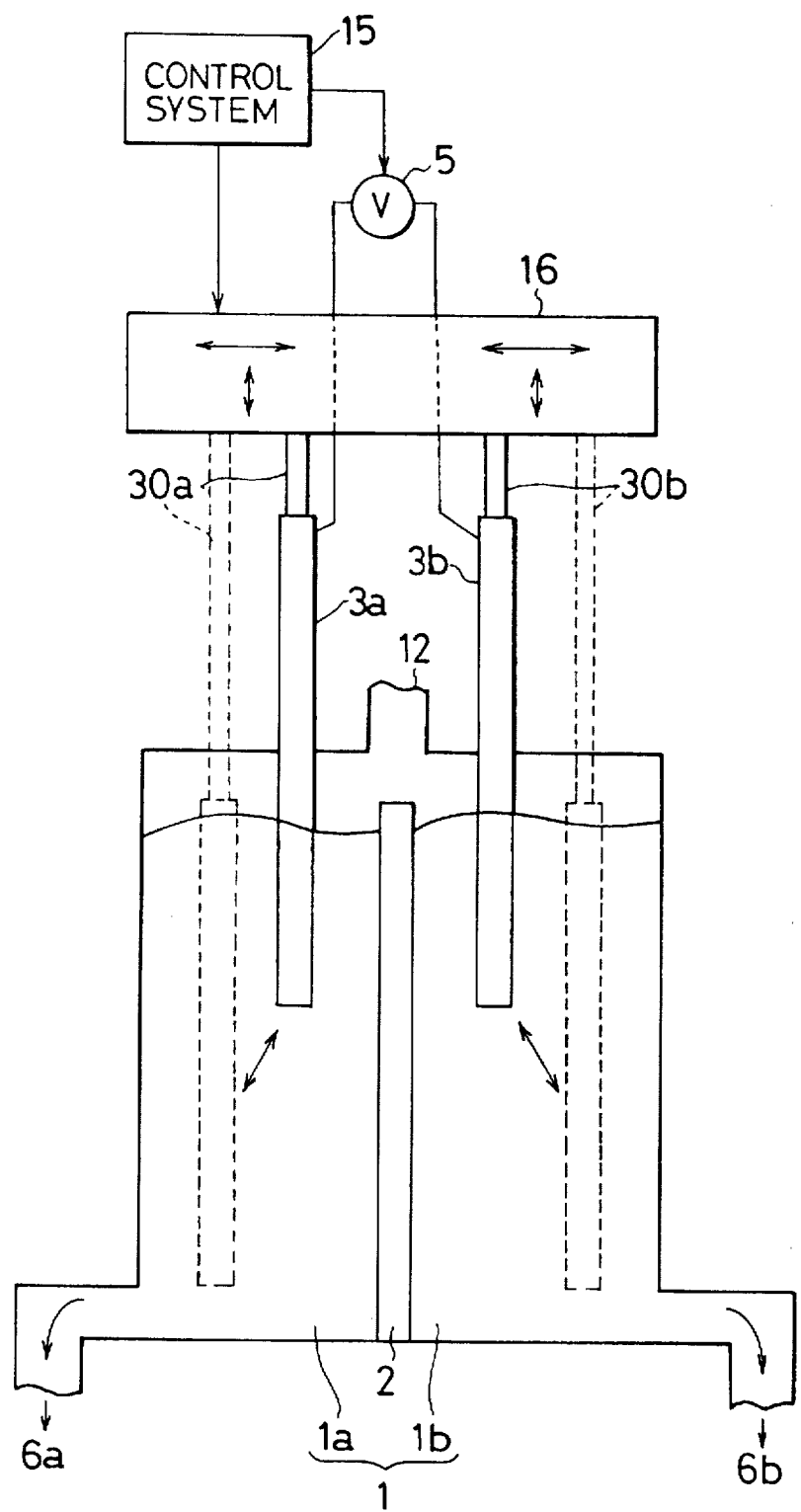
FIG. 4 is a schematic view illustrating an electrolytic cell used in a wet treatment apparatus in accordance with a second embodiment.

Hereinbelow, there will be explained a second embodiment with reference to FIG. 4 illustrating an electrolytic cell 1 and peripheral parts only. In this embodiment, the anode 3a and the cathode 3b are connected to an electrode mover 16 via arms 30a and 30b which are moved by the electrode mover 16 in the horizontal direction indicated by X, and also in the vertical direction indicated by Y. Thus, an area of the electrodes 3a and 3b are soaked in the pure water and the distance between the anode 3a and the cathode 3b can be varied independently of each other. In order to increase the production of electrolyzed water, the anode 3a and the cathode 3b are lowered into the pure water to thereby increase the soaking area of the electrodes 3a, 3b without raising the voltage applied to the electrodes 3a, 3b. To the contrary, in order to decrease the production of electrolyzed water, the anode 3a and the cathode 3b are raised up in the pure water to thereby decrease the soaking area of the electrodes 3a, 3b.

The control system 15 monitors ORP. When ORP shifts to a positive value in the anodic electrolyzed water or when ORP shifts to minus in cathodic electrolyzed water, the control system 15 transmits a signal to the electrode mover 16 so that either the arms 30a and 30b are lowered to thereby increase the soaking area of the electrodes 3a, 3b, or the arms 30a and 30b move away from each other to thereby increase the distance between the electrodes 3a and 3b. To the contrary, when ORP shifts to a negative value in the anodic electrolyzed water or when ORP shifts to a positive value in the cathodic electrolyzed water, the control system 15 transmits a signal to the electrode mover 16 so that either the arms 30a and 30b are raised to thereby decrease the soaking area of the electrodes 3a, 3b, or the arms 30a and 30b approach each other to thereby decrease the distance between the electrodes 3a and 3b. As a result, Qi is increased or decreased to thereby control ORP. After a necessary amount of electrolyzed water has been produced, the electrolysis area is made smaller, and electrolysis is continued with a small amount of the electrolyzed water being produced without stopping application of voltage to the electrodes 3a, 3b. Continuing electrolysis ensures that ions are always present in the pure water. Since the ions function as a trigger when electrolysis is to start for producing a larger amount of electrolyzed water, such a restart can be performed more easily than when electrolysis has to be restarted after electrolysis had been completely stopped, because it is no longer necessary to shorten again the distance between the electrodes. In addition, it is also no longer necessary to start electrolysis to obtain electrolyzed water having different characteristics. All that is needed for doing so is to adjust the pH or ORP only by the difference between the previous electrolyzed water and electrolyzed water to be newly obtained. It takes only a short period of time, and further saves energy. If the control of ORP reaches a step in which a fine adjustment is required, an applied voltage is also adjusted only by small degrees. Thus, it is possible to easily catch up with the ORP control speed.

Figure 5:
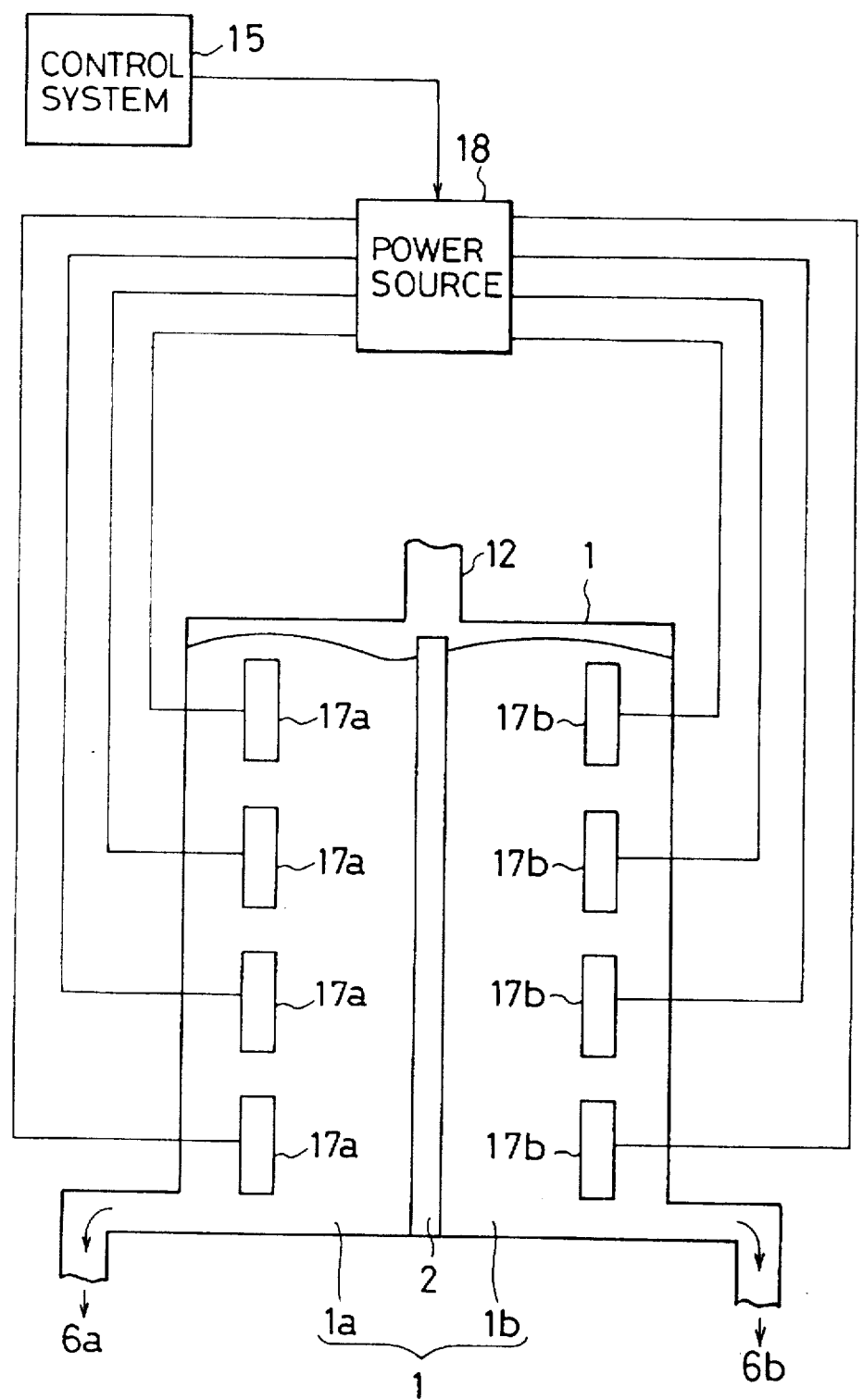
FIG. 5 is a schematic view illustrating an electrolytic cell used in a variation of the second embodiment.

FIG. 5 illustrates a variation of the second embodiment illustrated in FIG. 4. As illustrated, the anode 3a and the cathode 3b are divided into a plurality of sections 17a and 17b, respectively. A power source 18 is connected to each of the sections 17a and 17b. A voltage is applied to one or more of the sections to thereby vary the number of sections operating for producing electrolyzed water. Thus, an amount of electrolyzed water can be controlled as a function of the number of the sections 17a and 17b to which a voltage is being applied.

As an alternative to a single power source 18, the same number of power sources as that of the sections 17a and 17b may be prepared for connecting each of the power sources to each of the sections 17a and 17b. In addition, the electrodes 17a and 17b may be divided into the desired number of sections. Furthermore, the sections 17a and 17b may have equal surface areas or different surface areas from each other. The sections 17a and 17b may be equally spaced apart from each other, or may be spaced in different spaces from each other.

[Embodiment 3]

Figure 6:
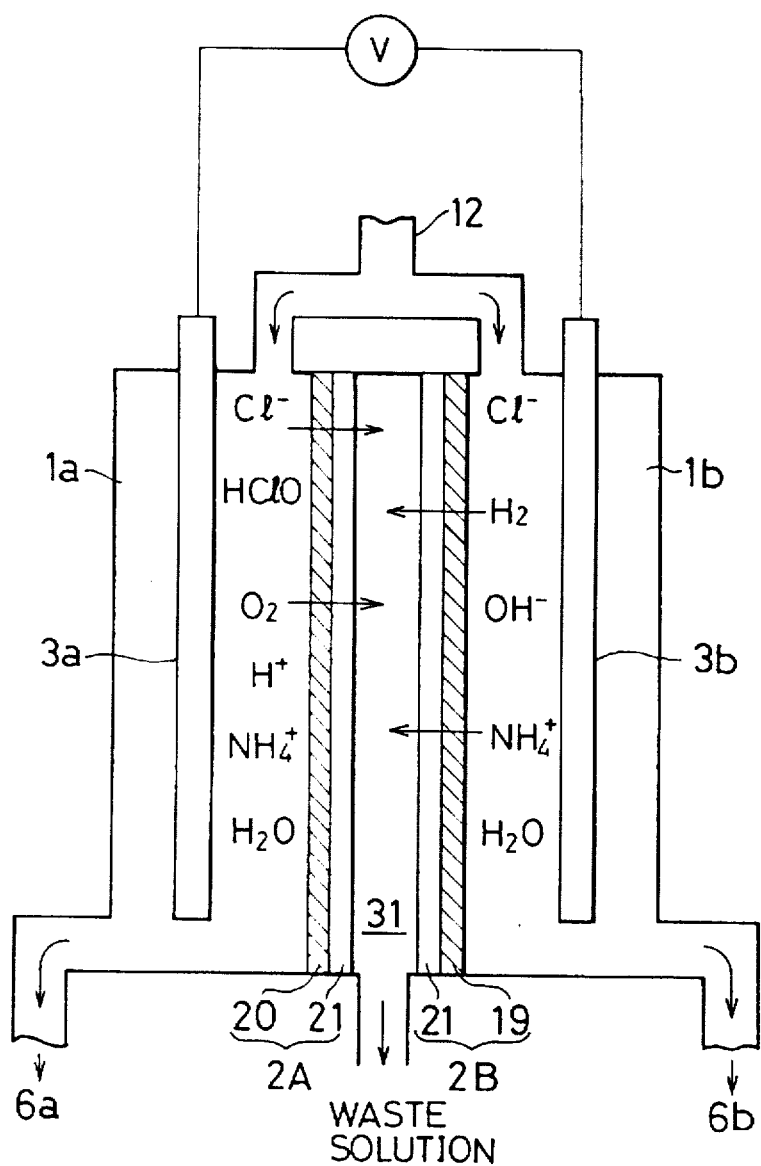
FIG. 6 is a schematic view illustrating an electrolytic cell used in a wet treatment apparatus in accordance with a third embodiment.

Hereinbelow, there will be explained a third embodiment in accordance with the invention with reference to FIG. 6. The sub-cells 1a and 1b are formed with sidewalls which are composed of partition membranes 2A and 2B. The partition membrane 2A and 2B of the sub-cells 1a and 1b face each other and are spaced from each other to thereby form a space 31 therebetween. The partition membrane 2A of the sub-cell 1a is composed of an internal cation exchange membrane 20 and an external gas-permeable membrane 21, while the partition membrane 2B of the sub-cell 1b is composed of an internal anion exchange membrane 19 and an external gas-permeable membrane 21.

In operation, pure water containing electrolyte therein is first introduced into each of the sub-cells 1a and 1b. Then, a voltage is applied across the anode 3a and cathode 3b. Then, pure water in the sub-cells 1a and 1b are electrolyzed, and then introduced to the disposal cells 6a and 6b. Waste solution is discharged through the space 31.

When ammonium chloride is used as the electrolyte, the aforementioned electrochemical reactions (a) to (e) and (f) to (h) occur at the anode 3a and the cathode 3b, respectively. Oxygen gas increases $H^+$ concentration, but does not have as high an oxidizing ability. On the other hand, ozone gas increases $HA^+$ concentration and has a high oxidizing ability. When ozone gas is oxidized, ozone gas is decomposed to oxygen gas. If most the of oxygen gas stays in electrolyzed water, $H^+$ ion are generated at the anode 3a. $H^+$ ion is gradually, electrically attracted to the cathode 3b at low speed. However, the cation exchange membrane 20 impedes $H^+$ ion from moving towards the cathode 3b, and hence $H^+$ ion is densified in the vicinity of the anode 3a. On the other hand, the anion exchange membrane 21 impedes OH− ion generated in the sub-cell 1b from moving towards the anode 3a, and hence OH− ion is densified in the vicinity of the cathode 3b.

[Embodiment 4]

Figure 7:
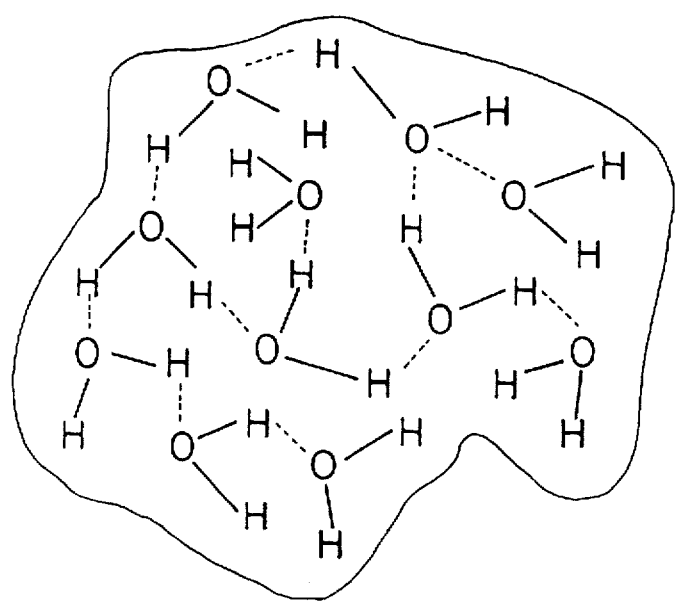
FIG. 7 is a schematic view illustrating a cluster of water molecules.

FIG. 7 illustrates a structure of water molecules. A water molecule $H_2O$ does not exist separately from other water molecules in water, but exist as a cluster in which several water molecules are hydrogen-bonded with each other. Accordingly, as is obvious from Table 1 listing molecular weights (MW) and boiling points of hydrogenated compounds, water exists a liquid at room temperature and has a high boiling point, specifically, approximately 100 degrees centigrade, unlike other hydrogenated compound such as $H_2S$ which is active gas at room temperature. In addition, pure water is considered to a slightly lower boiling point than that of tap water, because pure water has a smaller cluster than that of tap water, and is not influenced by impurities with respect to the raising of a boiling point and the lowering of a freezing point. Electrolyzed water has a smaller cluster than that of pure water, since a cluster is decomposed by electrolysis and $H^+$ ion and OH− ion are generated.

TABLE 1

MW and Boiling Point (BP) of Hydrogenated Compounds

|         | $H_2O$ | $H_2S$ | $H_2Se$ | $H_2Se$ |
|---------|--------|--------|---------|---------|
| MW      | 18     | 34     | 81      | 130     |
| BP [°C.]| 100    | −60    | −42     | 0       |

Figure 8:
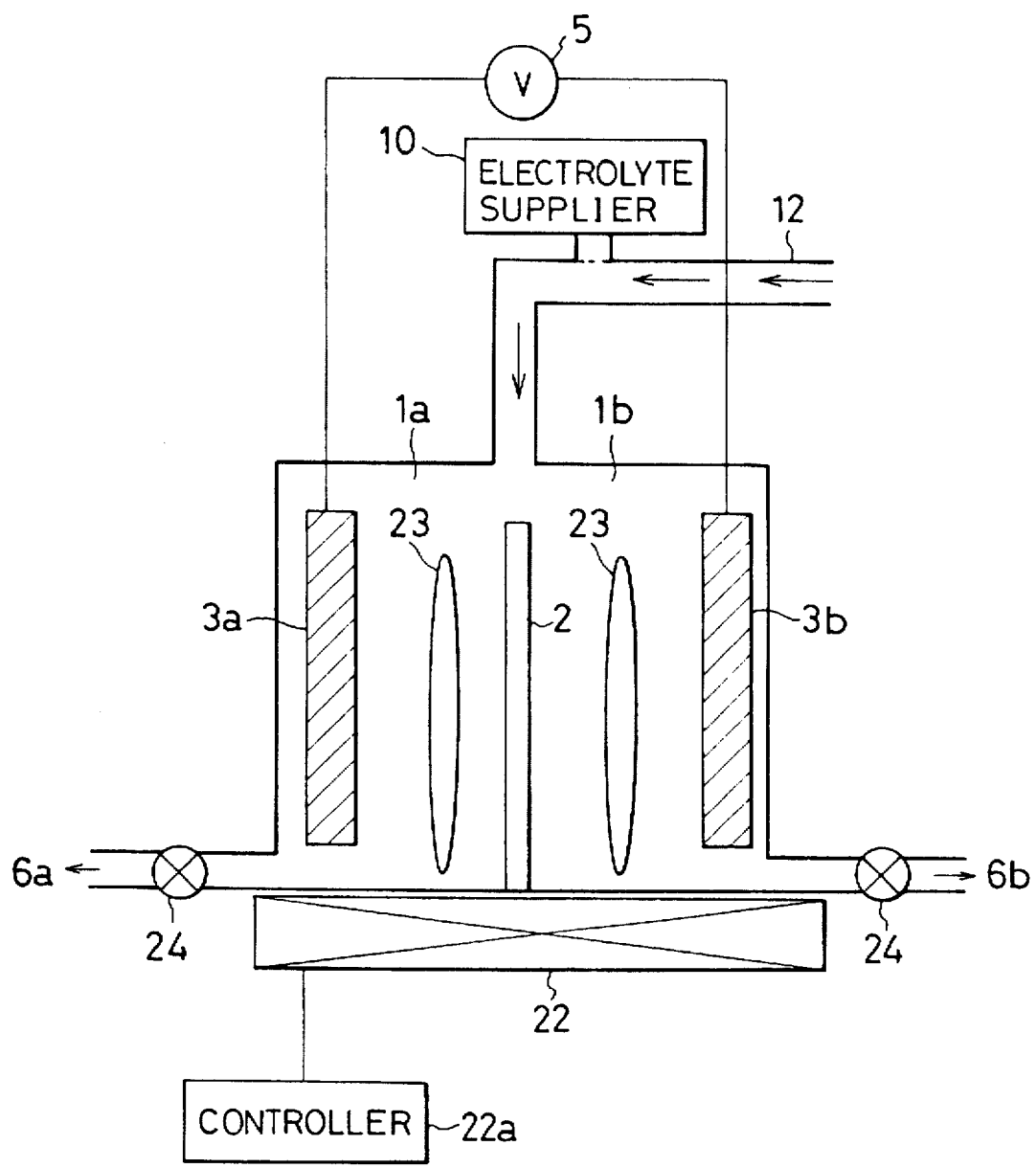
FIG. 8 is a schematic view illustrating a wet treatment apparatus in accordance with a fourth embodiment.

FIG. 8 illustrates a wet treatment apparatus in accordance with a fourth embodiment. A semiconductor substrate 23 is soaked in the electrolytic cell 1 between the anode 3a and the cathode 3b. The semiconductor substrate 23 is wet treated with a voltage being applied across the anode 3a and the cathode 3b. The electrolytic cell 1 is surrounded with a heater 22 for heating pure water contained in the electrolytic cell 1. The heater 22 is electrically connected to a controller 22a which controls the temperature of pure water to be in a desired range during electrolysis.

The heater 22 may be disposed in the electrolytic cell 1. As an alternative to the heater 22, various conventional heating means may be used such as resistive heating, lamp heating and microwaves heating. The heater 22 is controlled by the controller 22a to keep pure water at a temperature preferably in the range of 15 to 100 degrees centigrade, and more preferably in the range of 20 to 70 degrees centigrade.

[Embodiment 5]

Either anodic electrolyzed water or cathodic electrolyzed water is selectively used in accordance with the wet treatment. However, there is hardly a case in which both of anodic and cathodic electrolyzed water are to be used. Thus, though both anodic and cathodic electrolyzed water are produced by electrolysis, one of them which is not to be used has conventionally been wasted. In order to selectively obtain the desired one and not to produce the other to thereby save such waste, an apparatus in accordance with the fifth embodiment is designed to be able to vary the pressure in the sub-cells 1a and 1b of the electrolytic cell 1. In accordance with the embodiment, it is possible to efficiently produce only one of anodic or cathodic electrolyzed water independently of the electrolyte added to pure water and the voltage applied to the electrodes.

Figure 9:
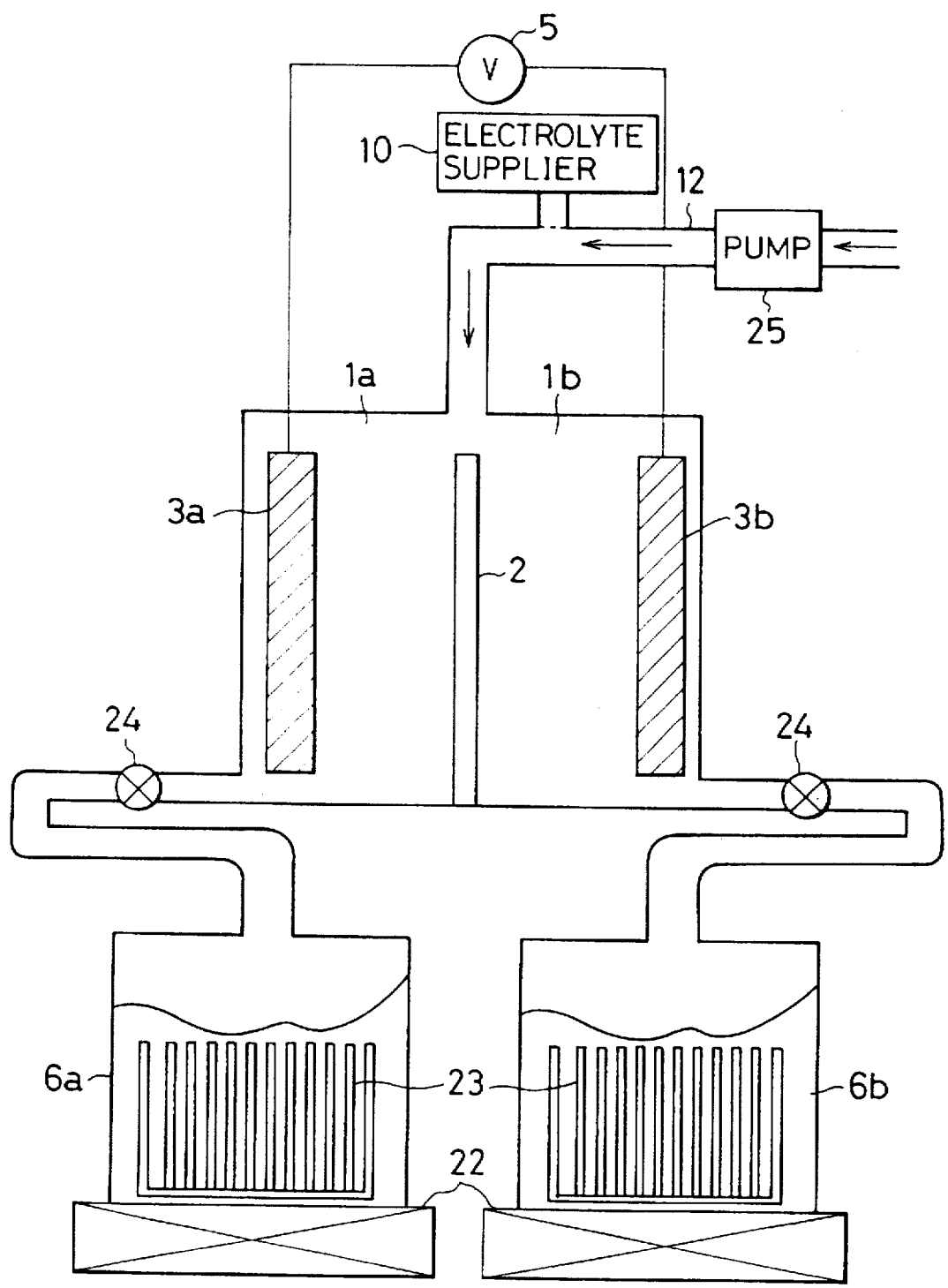
FIG. 9 is a schematic view illustrating a wet treatment apparatus in accordance with a fifth embodiment.

With reference to FIG. 9, a wet treatment apparatus in accordance with the invention will be explained hereinbelow. Into the electrolytic cell 1, there is introduced ultra-pure water having a semiconductor grade through the conduit 12. To the conduit 12, there is connected a helium (He) the pressure pump 25 for providing the pressure in the conduit 12 with highly pure He gas in order to prevent a counter flow in the conduit 12 which may occur due to a difference in pressure generated when the pressure of the electrolytic cell 1 is set to be higher than that of the conduit 12. As an alternative to He gas, other inert gas may be used. However, He gas is the best choice, because He gas, can provide highly pure gas and He gas does not influence wet treatments. If electrolysis is to be carried out with the electrolysis cell 1 kept at a lower pressure than that of the conduit, the He pressure pump 25 need not be installed, because there is no fear of a counter flow. In addition, it is preferable to carry out wet treatments of semiconductor substrates in a cell other than the electrolytic cell 1 in order to avoid the substrates from being damaged due to increased or decreased pressure in the electrolytic cell 1 during electrolysis. Thus, the disposal cells 6a and 6b are installed separately from the electrolytic cell 1 to be able to provide electrolyzed water produced in the electrolytic cell 1 to the disposal cells 6a and 6b which are maintained under atmospheric pressure.

If ammonium chloride is used as the electrolyte, there occur electrochemical reactions as represented by the above mentioned equations (a) to (e). In electrolysis under decreased pressure, a gas is actively generated. At the anode 3a, $O_2$ gas and $Cl_2$ gas are actively generated, while the generation of $O_3$ gas is suppressed. The generation of HClO and $HClO_3$ is also suppressed due to decreased amount of chlorine dissolved in pure water. At the cathode 3b, $H_2$ gas is actively generated, thereby producing many OH− ions. Thus, many $H^+$ ions or OH− ions are produced at either of the electrodes. By contrast in electrolysis under increased pressure, reactions opposite to those under decreased pressure actively occur. As a result, the generation of $O_3$ gas and $HClO_3$ actively occurs at the anode, whereby electrolyzed water having a high ORP is produced. At the cathode, electrolyzed water having high reducing ability is remarkably produced.

[Embodiment 6]

Figure 10:
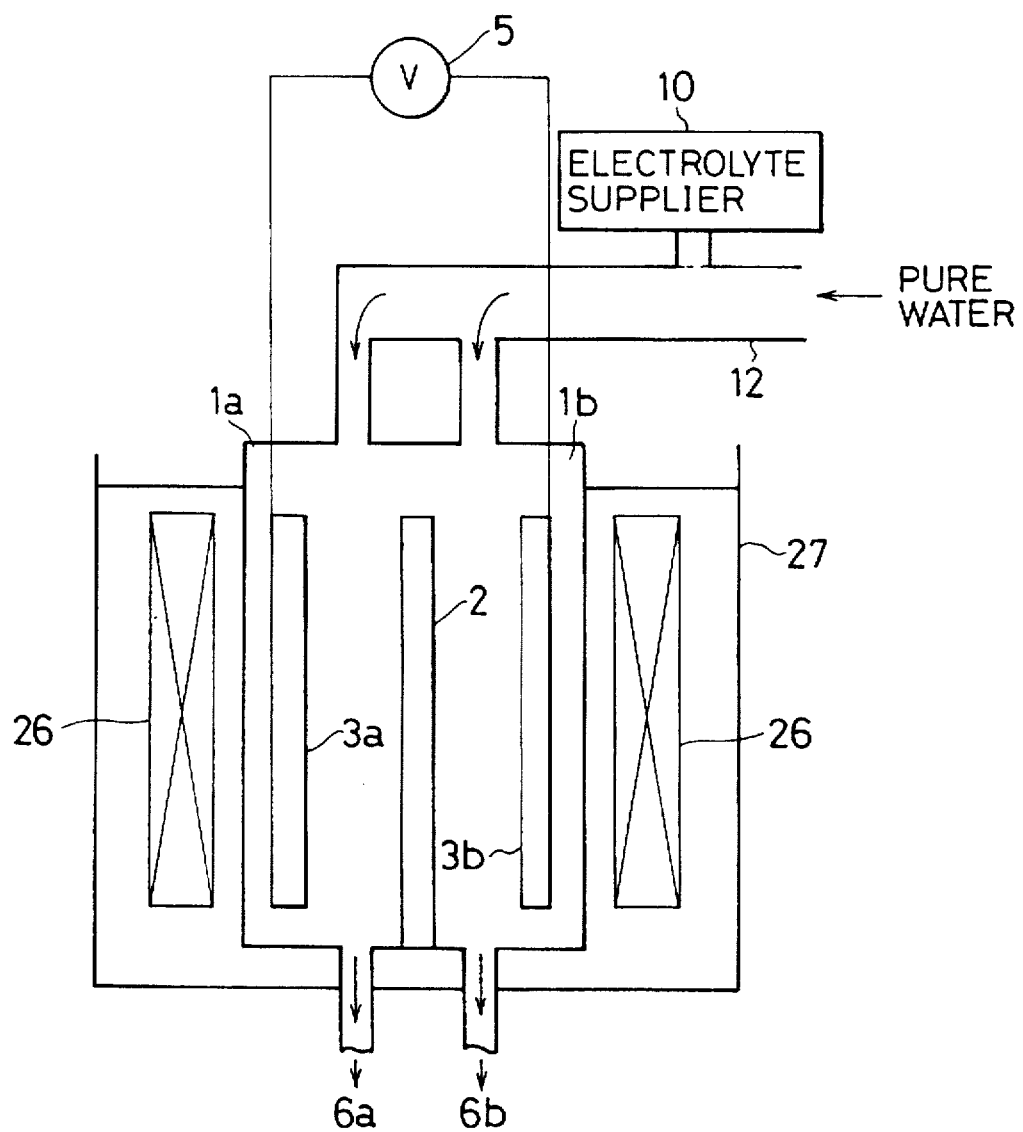
FIG. 10 is a schematic view illustrating a wet treatment apparatus in accordance with a sixth embodiment.

FIG. 10 illustrates a wet treatment apparatus in accordance with a sixth embodiment. Around the electrolytic cell 1, there is disposed an ultrasonic wave cell 27 in which ultrasonic wave generators 26 are installed. Electrolysis is carried out in the electrolytic cell 1 with ultrasonic waves having approximately 1 MHz of frequency being radiated from the ultrasonic wave generators 26 to pure water to be electrolyzed present in the electrolytic cell 1.

If water is provided from an outside source with energy such as ultrasonic wave oscillation, molecule movement is made more active with the result that a cluster, which hydrogen-bonds several water molecules with each other, is decomposed. Thus, a cluster becomes smaller and smaller. Since electrolyzed water is water in which a cluster is decomposed and also in which $H^+$ ion and OH– ion are produced, the provision of ultrasonic wave oscillation during electrolysis facilitates the decomposition of a cluster, thereby electrolysis can be easily carried out.

[Embodiment 7]

Figure 11:
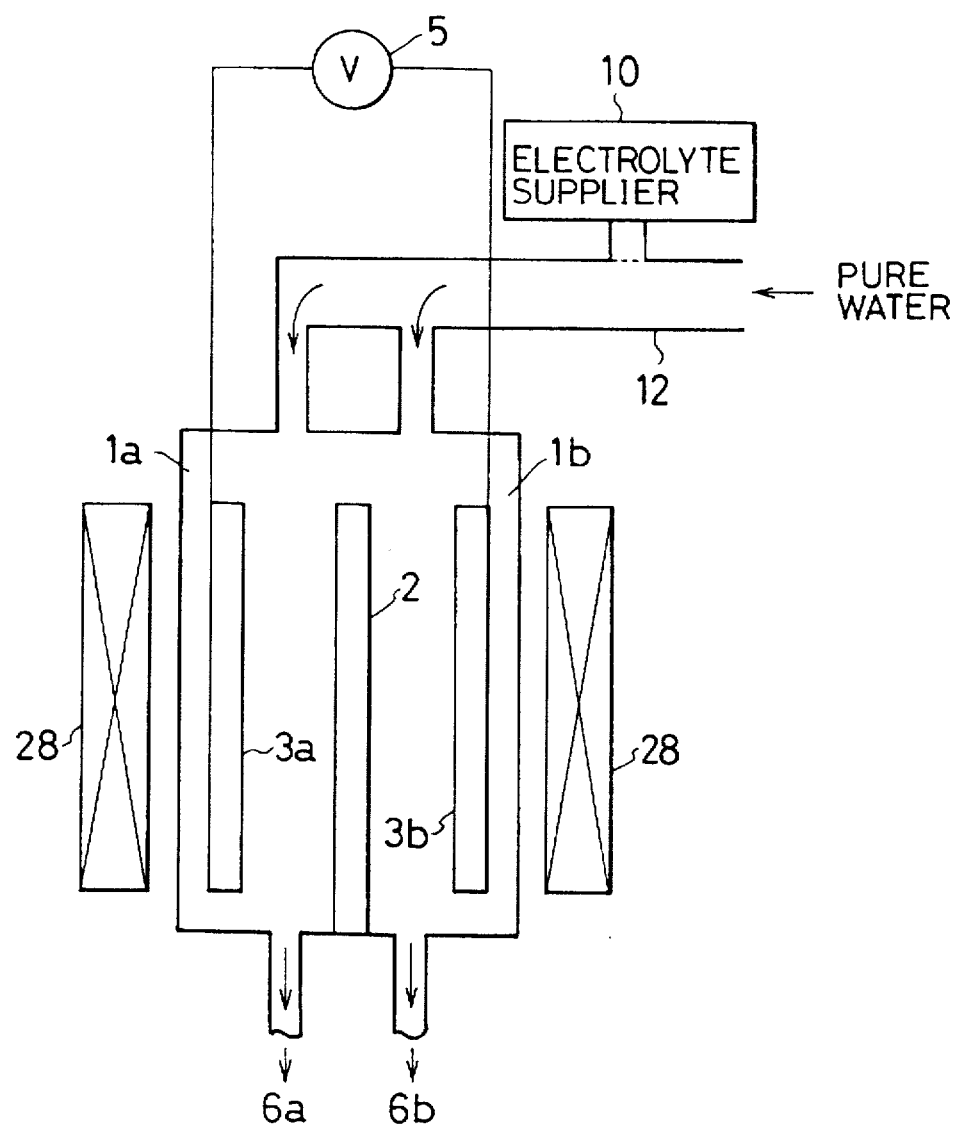
FIG. 11 is a schematic view illustrating a wet treatment apparatus in accordance with a seventh embodiment.

FIG. 11 illustrates a wet treatment apparatus in accordance with a seventh embodiment. Around the electrolytic cell 1, there is disposed a plurality of magnetic field applying devices 28 comprising a permanent magnet, an electromagnet or a combination thereof. If $H^+$ ion and OH– ion produced through electrolysis flow in a certain direction in the electrolytic cell 1, on applying a magnetic field to the ion's flow, the ion is deflected in accordance with the Fleming's left-hand rule. Specifically, $H^+$ ion and OH– ion are deflected in opposite directions. This phenomenon is generally explained as the generation of Lorentz's field. The electrolyzed water is made to flow from top to bottom in the electrolytic cell 1, and thus the flow of $H^+$ ion and OH– ion are produced. If the north pole of the magnet 28 is disposed beyond a plane of FIG. 11 and the south pole of the magnet 28 is disposed short of a plane of FIG. 11, the flow of $H^+$ ion is deflected toward the anode 3a and the flow of OH– ion is deflected toward the cathode 3b. The strength of Lorentz's field is dependent on a speed of the ion's flow. In general, the faster the ion flows, the greater strength the field can have. A voltage between the electrodes 3a and 3b becomes greater in accordance with the strength of the field, and the attenuation of ions occur at the center of the flow. Thus, around each of the electrodes 3a and 3b, there are gathered $H^+$ ion and OH– ion to thereby increase $H^+$ ion concentration and OH– ion concentration in the vicinity of the anode 3a and the cathode 3b, respectively. Accordingly, it is not necessary to dispose the partition membrane 2 in a certain electrolysis condition.

Each of the preferred embodiments has been explained independently of each other, however, it should be noted that two or more of the embodiments may be used in combination. Such a combination of the embodiments provides higher electrolysis efficiency than single use of the embodiments. In the combination use, it is preferable that each of the physical energy applying means such as the ultrasonic wave generator 26 used in the sixth embodiment is to be connected to and be controlled by a control system so that a pH value, ORP and an amount of dissolved gas are kept in a desired range.

As has been explained with reference to the preferred embodiments, the invention makes it possible to raise a speed of production of $H^+$ ion, OH– ion, oxidizing material and reducing material to thereby enhance the production efficiency without applying a higher voltage to the electrodes by designing a distance between the electrodes to be variable. In addition, since the electrolyte is selected among strong electrolyte containing halogen therein, it is possible to apply further lower voltage to the electrodes than the case in which a weak electrolyte is selected. Furthermore, compared to the case wherein electrolyte is used, the amount of electrolyte to be added to pure water can be decreased, and thus the use of chemicals can be further decreased.

The invention makes it also possible to obtain most of the electrolyzed water in a short period of time without applying a higher voltage to the electrodes by designing a variable electrolysis area. Thus, it is possible to carry out a desired treatment before ORP changes as times go by. As mentioned in the second embodiment, the electrodes are driven by a pair of arms which are movable independently of each other in the horizontal and vertical directions. Since the distance between the electrodes can be varied only by the movable arms, the wet treatment apparatus can be compact-sized.

Furthermore, the embodiment in which the electrodes are divided into a plurality of sections to which a voltage is to be applied makes it possible to vary the electrolysis area with the electrodes being soaked in the electrolyzed water. Thus, the embodiment ensures that the electrodes are not exposed to the atmosphere and hence are not polluted. In addition, it is possible to instantaneously vary the electrolysis area to thereby provide high controllability. If the production of electrolyzed water is continued with the electrolysis area kept small, ions are always present in the electrolyzed water. Since such ions function as a trigger for restarting electrolysis, it is easier to restart electrolysis than in the case in which electrolysis had been completely stopped and then electrolysis has to be started again, because it is no longer necessary to shorten the distance between the electrodes again. In addition, it is also no longer necessary to start electrolysis for obtaining electrolyzed water having different characteristics. All that is needed for doing so is to adjust the pH or ORP by setting up a difference between the previous electrolyzed water and the electrolyzed water to be newly obtained. It takes only a short period of time, and further saves energy. If the control of ORP reaches a step in which a fine adjustment is required, the applied voltage is also adjusted only by small degrees. Thus, it is possible to easily catch up with the ORP control speed and efficiently obtain electrolyzed water without applying a higher voltage to the electrodes.

In the third embodiment, the partition membrane is composed of a combination of an anion exchange membrane or a cation exchange membrane and a gas-permeable thin membrane. Thus, it is possible to discharge excessive oxygen gas and hydrogen gas out of the electrolyzed water, and hence the production of a hydrogen ion and oxidation reaction are not prevented, and gases are not allowed to stay in the electrolyzed water, whereby the electrolyzed water can be efficiently obtained. Thus, since it is no longer necessary to employ excessive electrical power and time for producing the electrolyzed water, a higher productivity can be obtained. In addition, since the anion exchange membrane is disposed in the sub-cell in which the anode 3a is disposed and the cation exchange membrane is disposed in the sub-cell in which the cathode 3b is disposed, and hence the $H^+$ ion cannot pass through the anion exchange membrane and the OH– ion cannot pass through the cation exchange membrane, it is possible to efficiently concentrate the $H^+$ ion in the sub-cell in which the anode is disposed, and also efficiently concentrate the OH– ion in the sub-cell in which the cathode is disposed.

It is difficult to decompose a water cluster at low temperature. The fourth embodiment in which the heater 22 is disposed around the electrolytic cell 1 can easily decompose a water cluster to thereby make it possible to easily carry out electrolysis. In addition, the raised temperature allows oxygen gas and hydrogen gas to easily volatilize, and hence the reaction for producing the $H^+$ ion and the OH– ion are facilitated. However, oxidizing material produced at the anode such as ClOx– and ozone gas has a high vapor pressure, and hence is volatilized at a temperature in the range of 80 to 100 degrees centigrade. Ammonium gas which is a reducing material produced at the cathode and which contributes to the production of hydrogen gas and OH– ion tends to be volatilized. Thus, if the temperature is raised too the oxidizing material and reducing material are disadvantageously lost. In view of these matters, the temperature is preferably in the range of approximately 15 to 100 degrees centigrade, and more preferably in the range of approximately 20 to 70 degrees centigrade. Thus, by optimizing the temperature, it is possible to enhance the efficiency of production of electrolyzed water.

In accordance with the fifth embodiment in which the pressure in the electrolytic cell 1 is variable, it is possible to carry out electrolysis with the sub-cells 1a and 1b being pressurized or depressurized independently of each other. Thus, it is possible to produce a larger amount of anodic electrolyzed water than cathodic electrolyzed water by selectively causing reactions in the sub-cell 1a in which the anode 3a is disposed, or produce a larger amount of cathodic electrolyzed water than anodic electrolyzed water by selectively causing reactions in the sub-cell 1b in which the cathode 3b is disposed. Hence, it is possible to efficiently obtain one of anodic and cathodic electrolyzed water, and reduce the production of the other. Furthermore, it is also possible to control the flow rate of electrolyzed water without dependency on the amount of electrolyte added to the pure water and the voltage applied to the electrodes, and hence the throughput can be enhanced and the use of chemicals can be reduced.

The sixth embodiment having the ultrasonic wave generator 26 provided therein facilitates the decomposition of a water cluster, and hence also facilitates the production of $H^+$ ion and OH– ion, with the result of enhancement of the efficiency of production of electrolyzed water. The degasification of oxygen gas and hydrogen gas is also facilitated. A combination of the ultrasonic wave generating means and the gas-permeable thin membrane could further facilitate electrolysis.

In accordance with the seventh embodiment in which a magnetic field applying means is provided, it is possible to concentrate $H^+$ ion and OH– ion around the electrodes, and hence it is also possible to efficiently obtain electrolyzed water. In addition, since it is possible not to use a partition membrane, the electrolysis efficiency can be enhanced. The purpose of the partition membrane, which is composed of, for instance, porous carbon, is to separate H+ ion from OH– ion, and thus the partition membrane is required to have a porosity so as not to allow ions to pass therethrough. As mentioned earlier, several water molecules form a cluster, and thus $H^+$ ion and OH– ion do not exist alone, but exist in such a way as bonding to a water cluster. However, if an ion does not flow at all between the electrodes, electrolysis can not be carried out. Hence, it is required that an ion be able to pass through the partition membrane to some degree. Accordingly, a small amount of strong electrolyte is added to the pure water. Since an ionized ion exists alone in the water, such ion can easily pass through the partition membrane However, it is obvious that the ion receives a larger resistance in the case where the ion has to pass through the partition membrane than in the case where there is no partition membrane. If electrolysis is carried out and only oxygen gas and hydrogen gas are produced it is not necessary to provide a partition membrane. In order to use the apparatus for wet treatment, it is absolutely necessary to produce $H^+$ ion and OH– ion, and hence it is not allowed to remove the partition membrane. However, the invention makes it possible not to use the partition membrane by applying a magnetic field to the electrolyzed water, and hence it is now possible to produce $H^+$ ion and OH– ion without preventing the flow of ion passing through the partition membrane. Thus, the electrolysis efficiency can remarkably be enhanced. In addition, by controlling the flow speed of electrolyzed water and/or the magnetic flux density of magnetic field applied to the electrolyzed water, it is possible to control the pH value and the concentration of oxidizing and reducing material which is dependent on ORP. Thus, it is possible to obtain a high concentration of electrolyzed water without increasing the use of chemicals, the voltage applied to the electrodes and the time required for electrolysis. As a result, the throughput can be remarkably enhanced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for producing electrolyzed water in a process for treating a semiconductor wafer with electrolyzed water, comprising the steps of:
   (a) adding an electrolyte into pure water purified through an ion exchanger to produce pure water containing an electrolyte;
   (b) producing electrolyzed water by applying a voltage to electrodes disposed in an electrolytic cell containing pure water and electrolyte therein;
   (c) controlling the temperature of said pure water during the step of producing electrolyzed water by applying heating means to the outside of said electrolytic cell to maintain said pure water at a temperature in the range of 20°–70° C.; and (d) applying said electrolyzed water to the semiconductor wafer.

2. The method as recited in claim 1, wherein said temperature of said pure water is controlled to be in the range of 20 to 70 degrees centigrade.

3. The method as recited on claim 1, wherein said electrolyzed water is anodic electrolyzed water.

4. The method as recited in claim 1, wherein said electrolyzed water is cathodic electrolyzed water.

5. The method as recited in claim 1, wherein said electrolyzed water is a mixture of anodic and cathodic electrolyzed water.

6. The method as recited in claim 1, wherein said temperature is more than 35° C. and less than or equal to 70° C.

7. The method as recited in claim 1, wherein said electrolyte is ammonium chloride.

8. The method as recited in claim 1, wherein an amount of said electrolyte added to said pure water is not more than 20 mM.

9. The method as recited in claim 1, wherein an amount of said electrolyte added to said pure water is not more than 80 mM.

10. A method for producing electrolyzed water in a process for treating a semiconductor wafer with electrolyzed water, comprising the steps of:

(a) adding an electrolyte into pure water purified through an ion exchanger to produce pure water containing an electrolyte;

(b) producing electrolyzed water by applying a voltage to electrodes disposed in an electrolytic cell containing pure water and electrolyte therein;

(c) controlling the temperature of said pure water during the step of producing electrolyzed water by applying heating means to the outside of said electrolytic cell to maintain said pure water at a temperature high enough to decompose a water cluster and to volatilize oxygen gas and hydrogen gas from said electrolyte and low enough to prevent an oxidizing material and a reducing material produced at said electrodes to be lost by volatilization, said heating means not in direct contact with said pure water; and (d) applying said electrolyzed water to the semiconductor wafer.

11. The method as recited in claim 10, wherein said temperature is more than 35° C. and less than or equal to 70° C.

* * * * *